United States Patent [19]
Guruswamy et al.

[11] Patent Number: 5,901,065
[45] Date of Patent: May 4, 1999

[54] APPARATUS AND METHOD FOR AUTOMATICALLY PLACING TIES AND CONNECTION ELEMENTS WITHIN AN INTEGRATED CIRCUIT

[75] Inventors: Mohan Guruswamy; Daniel W. Dulitz; Robert Maziasz, all of Austin, Tex.

[73] Assignee: Motorola, Inc., Schaumburg, Ill.

[21] Appl. No.: 08/597,768

[22] Filed: Feb. 7, 1996

[51] Int. Cl.[6] .............................. G06F 17/00; G06F 17/50
[52] U.S. Cl. ......................... 364/491; 364/489; 364/490; 364/488
[58] Field of Search .................................. 364/488–491; 361/56, 58, 91, 18; 437/33, 31, 32, 34, 63–66

[56] References Cited

U.S. PATENT DOCUMENTS

| | | | |
|---|---|---|---|
| 5,206,182 | 4/1993 | Freeman | 438/203 |
| 5,212,616 | 5/1993 | Dhong et al. | 361/18 |
| 5,313,079 | 5/1994 | Brasen et al. | 257/206 |
| 5,343,058 | 8/1994 | Shiffer, II | 257/204 |
| 5,420,061 | 5/1995 | Manning | 318/560 |
| 5,430,595 | 7/1995 | Wagner et al. | 361/56 |
| 5,535,134 | 7/1996 | Cohn et al. | 364/491 |
| 5,600,815 | 2/1997 | Lin et al. | 711/109 |
| 5,666,288 | 9/1997 | Jones et al. | 364/490 |

OTHER PUBLICATIONS

Chen et al. "Optimization of Quarter Micron MOSFETs for Low Voltage/Low Power Applications," IEEE, pp. 3.3.1–3.3.4, Dec. 1995.

Tsui et al. "Study of BiMOS Logic Gate Configuration for Improved Low–Voltage Performance," IEEE, pp. 371–374, Mar. 1993.

*Primary Examiner*—Kevin J. Teska
*Assistant Examiner*—Vuthe Siek

[57] ABSTRACT

Methods (100, 200, 250) and data processing system (300) for automatically placing ties (136, 138, 146, 148) and connection elements within an integrated circuit (120). Integrated circuit dimensions (102), element locations and element dimensions (104), and tie placement rules (106) are received for a particular integrated circuit (120). The quantities are then processed to place ties within the integrated circuit (108). Tie placement rules include tie spacings (164, 166), well edge spacings (162), and diffusion spacings (168) to prevent SCR latch up and gate threshold voltage drift. Tie placement methods (100, 200) automatically place ties within the integrated circuit (120) to comply with tie spacing rules and also consider estimated compactions so that tie numbers are minimized. Associated data processing system (300) and computer readable medium operate in conjunction with the methods of the present invention. A method of making an integrated circuit (350) optimally places ties and connection elements within an integrated circuit design.

32 Claims, 5 Drawing Sheets

APPARATUS AND METHOD FOR AUTOMATICALLY PLACING TIES AND CONNECTION ELEMENTS WITHIN AN INTEGRATED CIRCUIT

TECHNICAL FIELD OF THE INVENTION

This invention relates generally to integrated circuitry and more particularly to an apparatus and method for automatically placing ties and connection elements within integrated circuits.

BACKGROUND OF THE INVENTION

In the construction of an integrated circuit, the designer must compensate for operational difficulties that may arise for the particular construction of the integrated circuit. Typical operational difficulties include excessive current drain, substrate power up, localized heat generation beyond a limit, and other problems that are not apparent in the design of the integrated circuit but that are critical to the operation of the integrated circuit. These operational difficulties, of course, are affected by the physical design of the integrated circuit made from a logical design, the size of the integrated circuit, the process used to construct the integrated circuit, and the manner in which the integrated circuit is operated.

Figure 1:
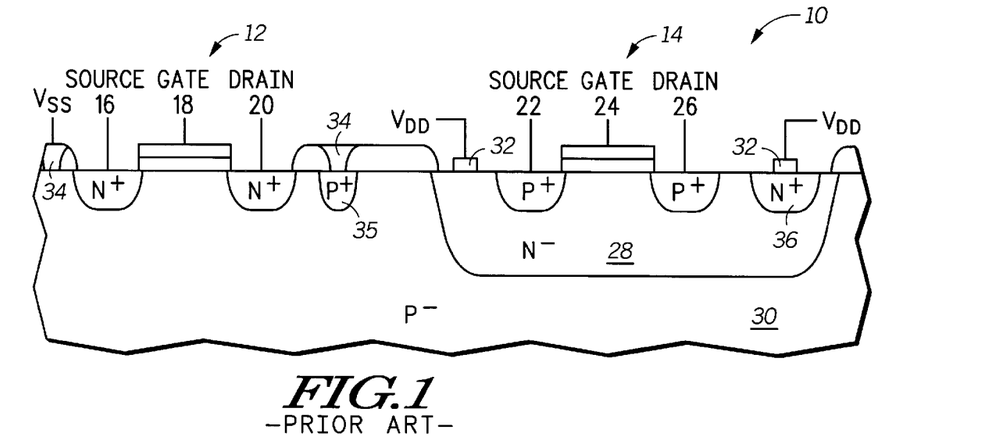
FIG. 1 is a diagrammatic sectional side view of prior art P-channel and N-channel transistor structures.

With particular reference to FIG. 1, a typical CMOS transistor 10 may include N-channel transistors 12 and P-channel transistors 14. The transistors 12 and 14 are connected such that they implement particular logic functions or portions of logic functions within an integrated circuit. Each N-channel transistor 12 includes a source 16, a gate 18, and a drain 20 while each P-channel transistor also includes a source 22, a gate 24, and a drain 26.

The N-channel transistor 12 is turned on by applying a voltage exceeding a threshold voltage to the gate 18. Once turned on, the N-channel transistor 12 conducts from its source 16 to its drain 20. Alternatively, the P-channel transistor 14 is turned on by applying a voltage lower than a threshold to its gate 24. Once the transistor is turned on, the P-channel transistor also conducts from its source 22 to its drain 26.

As is shown, when a P-type substrate 30 is used as the base for the integrated circuit, each P-channel transistor 14 is constructed within an N-type well 28 formed in the P-type substrate 30. The use of an N-type well 28 is required to prevent a direct short between the source 22 and substrate. Silicon controlled rectifier ("SCR") latch-up occurs when a forward bias exists at the substrate/well junction. Upon SCR latch-up, the integrated circuit ceases to function properly and consumes large quantities of power. To prevent SCR latch-up between the P-type material of drain 26, the N-type material of the well 28, and the P-type material of the substrate 30, the N-well 28 is tied to a first voltage reference level or $V_{DD}$. In this fashion, SCR latch-up is prevented by fixing the potential of the N-type well 28 at the first reference voltage $V_{DD}$.

Fixing the well 28 at the first reference voltage $V_{DD}$ also guarantees that the threshold gate voltage that must be applied to the gate 24 to turn the P-type transistor 14 on will remain constant during operation of the integrated circuit. Because the relative voltage differential between the gate 24 and the N-well 28 determines whether, and how rapidly, the inversion layer between the source 22 and the drain 26 will invert, the voltage differential must be controllable. The application of a voltage to the source 22 or the drain 26 affects the potential of the N-well 28. Thus well ties 32 along the N-type well 28 also serve to fix the voltage of the N-well 28 and ensure that the gate voltage threshold will remain constant. As shown, well ties 32 may be made directly between the source $V_{DD}$ and the N-well 28 or may be made between the source $V_{DD}$ and a more highly doped region 36 within the N-well structure.

With the N-channel transistor 12 as well, a voltage applied to the source 16 or drain 20 may alter the voltage of the substrate 30. In such a situation, if the voltage of the substrate 30 is not fixed, the gate threshold voltage required to turn on the N-channel transistor 12 through its application to the gate 18 will vary. Thus, substrate ties 34 are commonly used to fix the voltage potential of the substrate 30 at a reference potential $V_{SS}$. As shown, the substrate ties may be made directly to the substrate 30 or may be made to a more highly doped portion of the substrate 35.

The placement of ties within integrated circuits has typically been left up to the circuit designer who generates the physical design of the integrated circuit. Thus, the application of ties has been inconsistent and iterative alterations in their placement between the production of mask sets are sometimes required to enable a correct operation of the integrated circuit. Even when the placement of ties does not cause operational difficulties which must be fixed at a later time, the application or placement of ties within an integrated circuit has been a tedious and difficult process because of the various design rules that influence tie placement. The integrated circuit will have smaller dimensions when the ties are properly placed because properly placed ties allow for more efficient compaction.

The placement of other elements within a physical integrated circuit is also difficult and their improper placement causes operational difficulties within the integrated circuitry. For example, the placement of vias between a first layer and a second layer may interrupt signal paths within both the first layer and the second layer. While the proper placement of a via may increase a highest frequency of operation of the digital circuit, the placement of vias is often left up to the designer and does not include an automated process. Further, in an integrated circuit, antenna diodes are often used to reduce charge induced damage within the integrated circuit. While the antenna diodes reduce charge induced damage, their placement within the integrated circuit is difficult for the same reasons as is the placement of vias. Integrated circuit dimensions will also be reduced upon an efficient placement of vias due to increased compaction efficiencies that are possible.

Thus, there exists a need in the art for a method and apparatus for the automatic placement of ties and connection elements within integrated circuits based upon design rules.

DETAILED DESCRIPTION OF THE DRAWINGS

The present invention relates to an apparatus and method for automatically placing ties and connection elements within an integrated circuit. The method commences with the receipt of integrated circuit dimensions, element dimensions, and element locations within the integrated circuit. In this fashion, a partial physical description of the integrated circuit is received. Next, the method receives placement rules for the placement of ties or for the placement of connection elements within the integrated circuit. The method then processes the integrated circuit dimensions, the element locations, the element dimensions, and the placement rules to place a tie or connection element within the integrated circuit. Based upon the processing, the ties and connection elements are placed at optimum locations within particular regions of the integrated circuit. The placement of the ties and connection elements then complies with placement rules across the integrated circuit, while minimizing their impact on integrated circuit dimensions. In this fashion, the method of the present invention relieves an integrated circuit designer from the tedious and monotonous task of hand placing ties within an integrated circuit, while ensuring a highly efficient tie arrangement.

Figure 2:
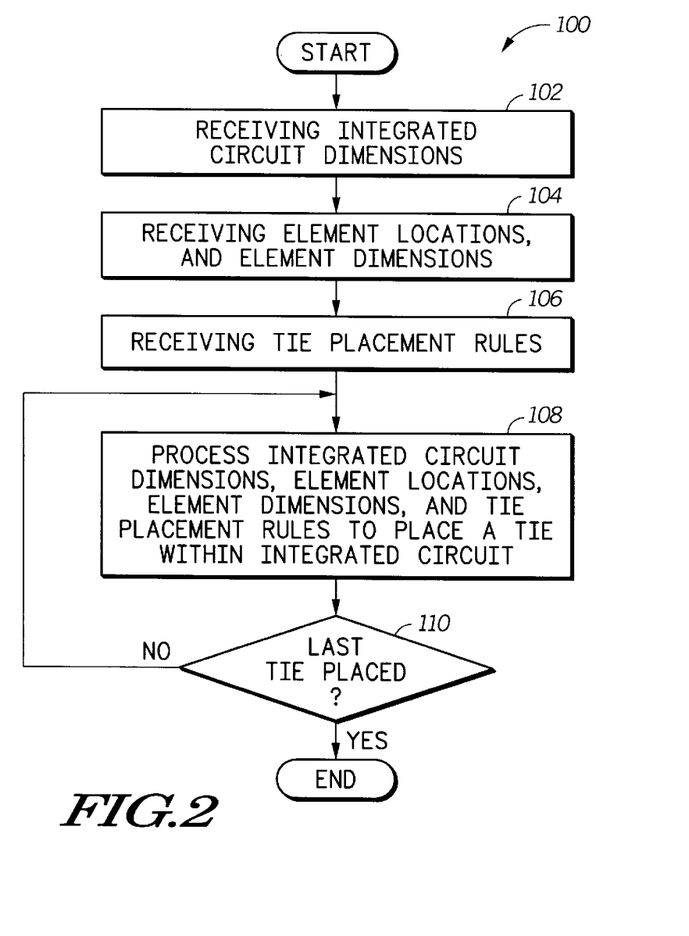
FIG. 2 is a flowchart illustrating a method for placing ties within an integrated circuit in accordance with the present invention.

FIG. 2 illustrates a method 100 for placing ties within an integrated circuit. The method commences at a first step 102 of receiving integrated circuit dimensions. The integrated circuit dimensions preferably relate the outer dimensions of the integrated circuit as well as particular placement of wells, supply rails, and other major elements within the integrated circuit. These particular integrated circuit dimensions preferably are derived during a design step in an integrated circuit design process. Thus, these dimensions do not relate final dimensions of the integrated circuit but are intermediate computer aided design (CAD) dimensions established for the purpose of constructing a physical design of the integrated circuit.

Next, the method 100 includes the step of receiving element dimensions and element locations within the integrated circuit 104. Preferably, the elements include transistors, resistors, capacitors, diodes, connections between elements, and elements that are required to cause the integrated circuit to properly function. Preferably, element dimensions establish outer boundaries of respective elements as well as the various intra-element boundaries associated with the element, such as drain boundaries, gate boundaries, and source boundaries. Preferably, the element dimensions include at least two dimensions, height and width, but may also include preferred depth of element portions. Preferably, the particular element dimensions are derived during a design step and do not relate final dimensions of the elements within a manufactured integrated circuit. Based upon the element locations and dimensions, relative locations between the elements may also be determined. With the receipt of the integrated circuit dimensions in step 102 and the element locations and element dimensions in step 104, a basic physical layout of the integrated circuit is established.

Next, at step 106, the method 100 includes receiving tie placement rules. Tie placement rules typically relate maximum distances between particular elements, or portions of elements, and ties within the integrated circuit based upon design rules. The ties may include either substrate ties or well ties depending upon the portion of the integrated circuit under consideration. As illustrated FIG. 1, a well tie comprises a connection between a first reference voltage $V_{DD}$ and a well within the integrated circuit while a substrate tie comprises a connection between a second reference voltage $V_{SS}$ and the substrate of the integrated circuit. Tie placement rules, when adhered to, guarantee that gate threshold voltage limits will not be violated and that the integrated circuit will not suffer from SCR latch-up.

In a preferred form of the present invention, three separate tie placement rules are adhered to. The first tie placement rule is called "tie spacing," that is a maximum distance between adjacent ties within the integrated circuit. In the case of an integrated circuit including both P-channel and N-channel transistors, two differing tie spacings must be considered. A first tie spacing is a maximum distance between well ties while a second tie spacing is a maximum distance between substrate ties. Tie spacing typically relates to a horizontal distance across the integrated circuit. In a typical integrated circuit, cells are arranged in rows across the substrate surface, each of the cells performing a particular logical function and interconnected with other cells. Power and ground rails define upper and lower boundaries of the rows of cells and provide power and ground to the cells. In a preferred form of the invention, tie spacing is a maximum distance in a direction parallel to the rows of cells.

The second preferred tie placement rule is called "well edge spacing" which relates a maximum spacing distance between an edge of a well and a well tie. Preferably, well edge spacing is measured in a direction perpendicular to the rows of cells within an integrated circuit. Thus, in a preferred form of the present invention, tie spacing and well edge spacing are rules that apply perpendicularly to one another.

The third preferred tie placement rule is called "diffusion spacing." Diffusion spacing is a maximum distance between active diffusion and a tie taken in any direction across the integrated circuit surface. Thus, the diffusion spacing rule must be satisfied in two dimensions across the integrated circuit.

Tie spacing, well edge spacing, and diffusion spacing are typically fixed for the integrated circuit. However, spacing between ties will vary depending upon which of these rules is most stringent for a particular location on the integrated circuit. Determining which rule is most stringent for a particular location within the integrated circuit depends upon elements proximate to the specific location. For example, transistor sizes near a tie will determine a maximum distance between a tie and a subsequent tie, according to the diffusion spacing rule. Thus, spacing between ties must be determined for the placement of each particular tie within the integrated circuit to optimize tie placement and minimize the number of ties required to satisfy tie placement rules. In addition to these three tie placement rules, every tie must be placed at or beyond a minimum distance from adjacent elements so that the integrated circuit may be manufactured. In other words, the normal CAD design rules for the integrated circuit must also be satisfied.

From step 106 the method proceeds to step 108 which processes the integrated circuit dimensions, the element locations, the element dimensions, and the tie placement rules to place a tie within the integrated circuit. Preferably, this step includes considering a present location of interest within the integrated circuit where a last tie has been placed and selecting a new tie placement location. Thus, with the tie placement rules received in step 106, step 108 includes processing the tie placement rules to determine maximum distances to the new tie placement location.

From step 108 the method proceeds to decision step 110 which determines whether a last tie has been placed within the integrated circuit. If at step 110 a last tie has not been placed, the method proceeds again to step 108 wherein another tie within the integrated circuit is placed. However, if at step 110 it is determined that the last tie has been placed, the method ends. Preferably, many ties are placed within an integrated circuit to guarantee the proper operation of the integrated circuit. Thus, step 108 will be executed numerous times in order to place all of the ties within the integrated circuit.

The method 100 of the present invention may be used to place ties within any integrated circuit or in any portion of an integrated circuit. In one application, the method 100 may be used to place ties within the cells of a standard cell library, wherein the cells of the standard cell library are used over and over to create an overall integrated circuit design. In other applications, the method 100 may be used to establish ties across a complete integrated circuit or a module of the integrated circuit that does not use the standard cell design approach.

Therefore, the method 100 of the present invention automatically places ties within an integrated circuit with such placement conforming to the complicated tie placement rules. In this fashion, compliance with tie placement rules is certain and errors and inefficiencies that were previously introduced by the designer are eliminated. Thus, the method 100 not only reduces time and cost in the placement of ties within the integrated circuit design, it reduces costs associated with fixing problems in designs that only became evident after the integrated circuit was fabricated and tested.

Figure 3:
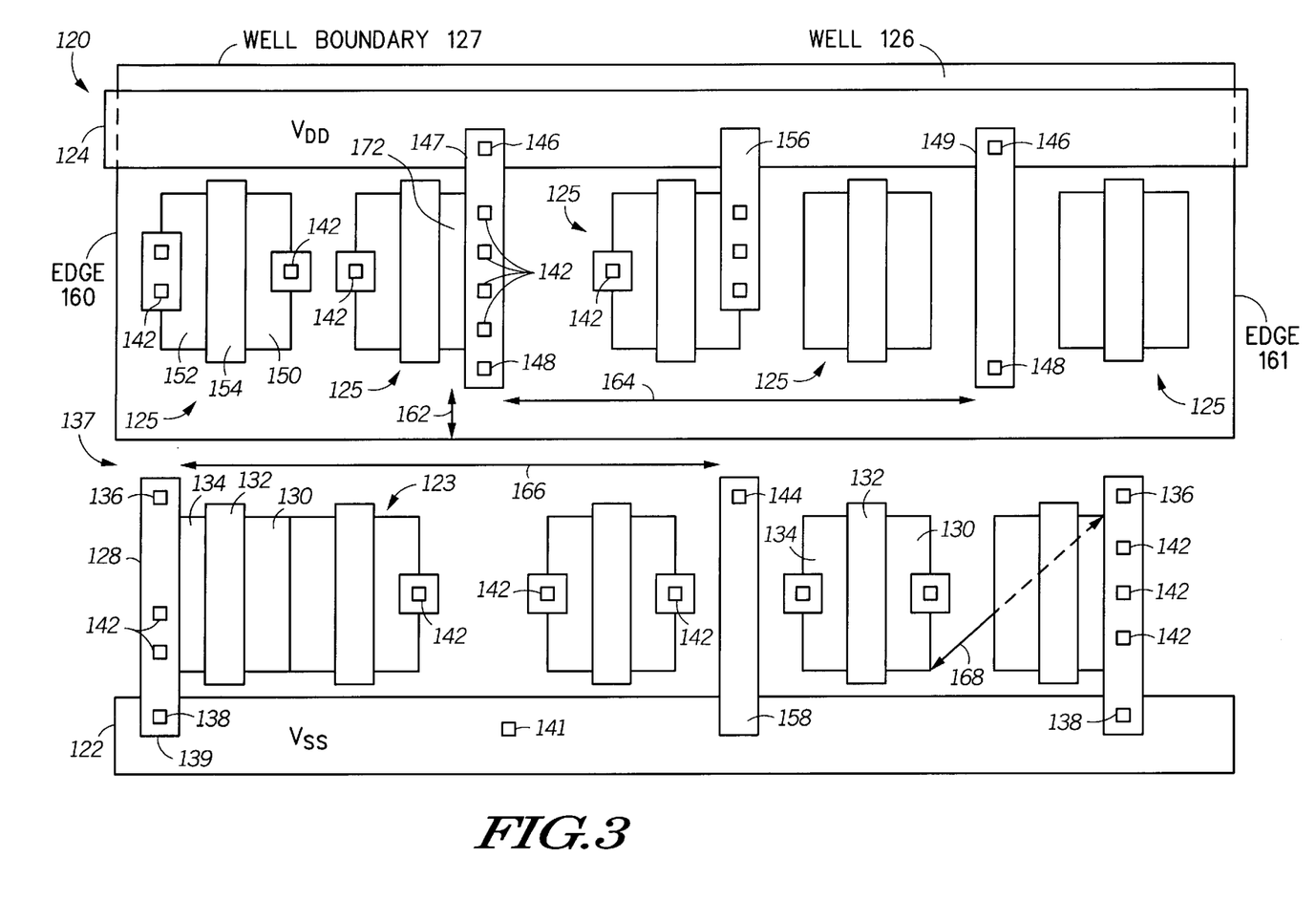
FIG. 3 is a diagrammatic top view of an integrated circuit having ties placed in accordance with the present invention.

FIG. 3 illustrates a portion of an integrated circuit 120 that has had its ties placed in accordance with the method 100 of FIG. 2. The integrated circuit 120 includes a ground rail 122 fixed at a first reference voltage $V_{SS}$ and a power rail 124 fixed at a second reference voltage $V_{DD}$. The power rail 124 resides in proximity to a plurality of P-channel transistors 125 disposed in a row across the integrated circuit 120. Each P-channel transistor 125 includes a source 150, a drain 152, and a gate 154. The P-channel transistors 125 are formed within a well 126 defined by a well boundary 127. As previously illustrated in accordance with FIG. 1, the well 126 is doped N-type while the substrate comprising the integrated circuit 120 is a P-type substrate. Therefore, each of the P-channel transistors 125 is formed in a portion of the well 126.

The integrated circuit 120 also includes a plurality of N-channel transistors 123, each including a drain 130, a source 134, and a gate 132. The N-channel transistors 123 are disposed in a row across integrated circuit 120 and formed within the P-type substrate of the integrated circuit. Of course, the N-channel transistors 123 could be formed in a differently doped surface portion of the substrate.

The integrated circuit 120 illustrated in FIG. 3 is a portion of two rows of transistors within a larger integrated circuit. Preferably, the integrated circuit 120 includes hundreds of rows, each having a width hundreds of times as wide as the portion shown in FIG. 3. The portion shown in FIG. 3 may represent a cell within the integrated circuit 120 that is interconnected with various other cells to accomplish the goals of the integrated circuit 120. Tie placement rules apply to all portions of the integrated circuit and therefore apply to each cell within the integrated circuit. In accordance with one application of the present invention, ties are placed within each cell of a standard cell library such that when the cells of the standard cell library are used together, the tie placement rules are satisfied across the integrated circuit as a whole. Thus, the integrated circuit 120 portion illustrated in FIG. 3 is used simply to demonstrate the teachings of the present invention, with the teachings applicable to various other integrated circuits as well.

The integrated circuit portion 120 is defined by a first vertical edge 160 and a second vertical edge 161 as well as the power rail 124 and the ground rail 122. In accordance with the present invention, the method 100 of placing ties in accordance with FIG. 1 commences at a left edge 160 of the integrated circuit and proceeds toward a right edge 161 of the integrated circuit. The left edge 160 of the row containing the P-channel transistors 125 is a first reference location from which is determined where a subsequent well tie must be placed. If the edge 160 represents an outer edge of the complete integrated circuit 120, a particular well tie spacing will be required. However, if the edge 160 represents an edge of a cell that abuts an edge of another cell, it is assumed that a well tie resides within a certain distance of the edge 160. Thus, the tie placement rules, when applied, may produce differing well tie spacing requirements from the edge 160 for the different cases.

Based upon the tie placement rules, a distance from the edge 160 to a next well tie must be less than a maximum spacing distance. This distance is based upon the elements proximate to the edge 160, the particular design rules for the integrated circuit, standard circuit design rules, substrate characteristics, well characteristics, as well as various other characteristics and rules. A well tie 146 or 148 is then placed within the determined distance from the edge 160.

As illustrated, ties 146 and 148 differ from contacts to transistors 142 in that they physically connect the second reference voltage 124 to the well 126. A conductive structure 147 ties the second reference voltage $V_{DD}$ to both a well tie 146 underneath the power rail 124 and a well tie 148 near an edge of the well 126. When a well tie 148 near the well 126 edge is not required to satisfy tie placement rules, a well tie 146 may simply be made below the power rail 124 to the well 126 without extending the conductive structure 147. The conductive structure 147 illustrated also couples the power rail 124, biased at $V_{DD}$, to a source 172 of the associated P-channel transistor 125. Thus, the conductive structure 147 serves to both power the source 172 of the P-channel transistor 125 and to provide a well tie 148 connection.

A well edge spacing rule is illustrated by distance 162. Well edge spacing represents a maximum spacing distance between an edge of the well 126 and a tie 148 or between an edge of the well 126 and a tie 146. Because the substrate is tied to the ground rail 122 at $V_{SS}$, well ties 148 must be placed no greater than the well edge spacing 162 from a well edge to prevent the voltage of the well from drifting toward the voltage of the substrate. In a preferred method of the present invention, the well edge spacing is measured in a distance perpendicular to the row of transistors within the integrated circuit 120. Thus, the well tie 148 satisfies the well edge spacing 162. Well ties 146 may simply be placed under the power rail 122 as required without requiring a separate conductive structure such as conductive structure 147. The well tie 146 is simply a conductive contact between the power rail 124 and the well 126 of the integrated circuit 120.

Tie spacing between well ties in a direction parallel to the row of transistors in the integrated circuit 120 portion is represented by distance 164. The tie spacing rule is satisfied by the two well ties 148 illustrated that reside near the channel region 137. It is important to note that the channel region 137 should not be confused with the channel region of a gated transistor. The channel region 137, as used herein, is the separation region between the P-channel transistor region and the N channel transistor region and is not a gated region of a transistor. The rule is also satisfied by the particular spacing between well ties 146 under the rail 124. As illustrated, the conductive structure 149 that provides the second well tie 148 near the well 126 edge is deposed within a diffusion break and does not provide a voltage $V_{DD}$ to a P-channel transistor 125 source 150 as did the prior conductive structure 147. No transistors reside within the diffusion break. In some cases, such as the conductive structure 147 illustrated, the placement of a well tie near a P-channel transistor 125 does not affect the location of the transistor 125. However, in other cases, the placement of a well tie 148 near a transistor affects the placement of connections between Pchannel transistors 125. The placement of well ties within a diffusion gap further provides the benefit of allowing for a greater compaction density during a compaction step that is preferably performed after the method of the present invention.

Substrate ties 138 and 144 are placed within the row of N-channel transistors 123 to satisfy the tie placement rules. Substrate tie 136 near the channel region 137 is located substantially midway between the power rail 124 and the ground rail 122 while substrate tie 138 is located under the ground rail 122. Both of the substrate ties 136 and 138 connect to conductive structure 128 which is connected to the ground rail 122 at voltage $V_{SS}$ and to the source 134 of N-channel transistor 123 at connections 142. In this fashion, the conductive structure 128 performs the dual purpose of connecting to the substrate ties 136 and 138 as well as connecting to the transistor source 134.

Substrate ties may simply be placed under the power rail 122 as required without requiring a separate conductive structure such as substrate tie 141. When placed under the power rail 122, the substrate tie does not hinder subsequent compaction of the integrated circuit as it could if it were in the channel region 137. Substrate tie 141 is simply a conductive contact between the ground rail 122 and the substrate of the integrated circuit 120. The contact 141 may be contacted to an underlying heavily doped P region and may be filled with a tungsten plug, polysilicon, aluminum, titanium nitride, silicide, or another known via conductive material or conductive composite. A particular substrate tie spacing distance 166 shows a maximum distance between substrate ties 136 and 144 parallel to the row of N-channel transistors 123.

A diffusion spacing 168 is illustrated as a maximum distance in any direction between active diffusion within the transistor and a substrate tie 136. As illustrated, an extreme edge of a diffusion region of an N-channel transistor 123 must be within the diffusion spacing distance 168 from the nearest substrate tie 136. As illustrated, a diffusion region may be either a drain 130 or a source 134 of an N-channel transistor 123. Alternatively, a diffusion is also either a drain 152 or a source 150 of a P-channel transistor 125 formed within the well 126. Thus, the diffusion spacing rule applies to the P-channel transistors 125 as well as the N-channel 123 transistors. Because the diffusion spacing distance 168 considers the distance between any diffusion point on the integrated circuit 120 and a respective well or substrate tie, the diffusion spacing rule applies in two dimensions unlike the tie spacing rule and the well edge spacing rule that apply only in single dimensions.

Thus, ties have been placed within the integrated circuit 120 of FIG. 3 in accordance with the method 100 of the present invention. The ties 136, 138, 146, and 148 were placed in accordance with the tie placement rules to prevent SCR latch up and gate threshold voltage variances.

Figure 4:
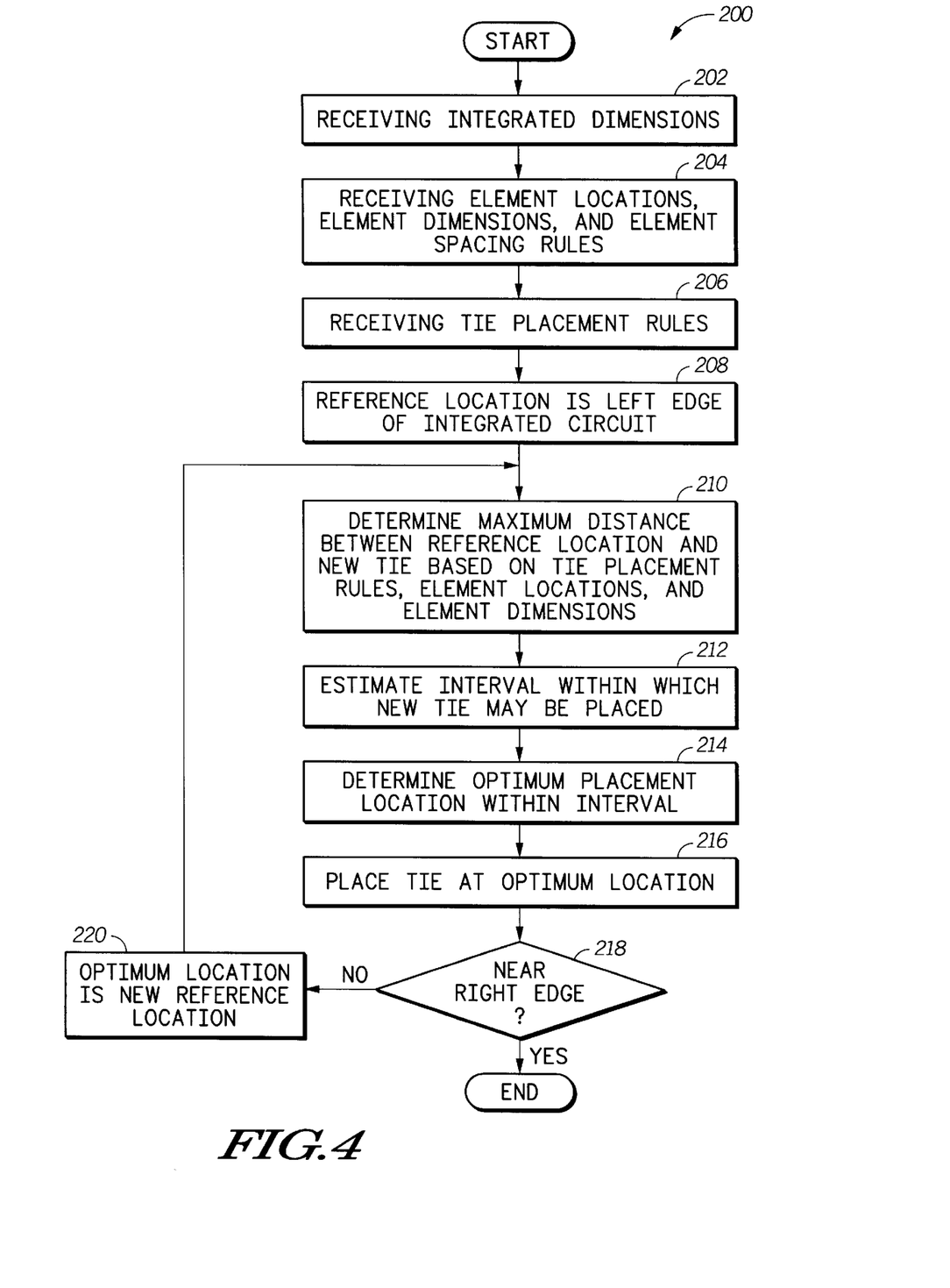
FIG. 4 is a flowchart illustrating a method for placing ties within an integrated circuit in accordance with the present invention.

FIG. 4 illustrates an alternative method 200 for automatically placing ties within an integrated circuit. The method 200 commences at step 202 of receiving the dimensions of an integrated circuit. As with the method 100 of FIG. 2, method step 202 preferably includes receiving integrated circuit dimensions that represent fully the outer boundaries of the integrated circuit as well as the important dimensions within the integrated circuit. Next, at step 204, the method includes receiving element locations, element dimensions, and element spacing rules. In this fashion, the combination of steps 202 and 204 provides a partial physical description of the integrated circuit. Prior to the execution of the method 200 of the present invention, elements have been placed within the integrated circuit. Preferably, the method 200 is performed prior to routing of connections within the integrated circuit. However, the method 200 could also be performed after some signal routing has been completed. After the method 200 has been completed, a compaction step is performed to establish the final locations of the elements within the integrated circuit. Such compaction is performed to minimize the integrated circuit dimensions in accordance with integrated circuit design rules.

Next, at step 206, the method 200 includes receiving tie placement rules. As was previously described, tie placement rules preferably include tie spacing, well edge spacing, and diffusion spacing. These spacings represent boundary conditions for the placement of ties within the integrated circuit. Further, as was previously described, the tie placement rules may be static or they may be dynamic based upon the particular elements in consideration within the integrated circuit and the particular locations under consideration with the integrated circuit. Therefore, the tie placement rules will vary from integrated circuit and from location to location within the integrated circuit based upon the integrated circuit design, the process used for manufacture, the operational voltage of the integrated circuit, and other factors affecting the operation of the integrated circuit.

Next, at step 208, the method includes establishing as a reference location the left edge of the integrated circuit. As was described in reference to the integrated circuit 120 of FIG. 3, a left edge 160 of the integrated circuit may be an edge of the overall integrated circuit or may simply be an edge of a cell within an integrated circuit library.

Next, at step 210, the method includes determining a maximum distance between the reference location and a new tie to be placed based upon tie placement rules, element locations, and element dimensions. As was previously discussed, the maximum distance will be based upon a tie spacing, a well edge spacing, and a diffusion spacing that are calculated for the particular reference location. For example, with the reference location located at an edge of a cell that will be placed adjacent to other cells, it is presumed that a tie has been placed in an adjacent cell. In this fashion, the maximum distance from the cell edge within which to place a tie will be approximately one-half of the overall maximum spacing distance. Thus, with a one-half spacing distance in each of two adjacent cells, the distance between nearest ties in adjacent cells satisfies the maximum distance.

Next, at step 212, the method 200 includes estimating an interval within which a new tie may be placed. This interval is based upon the maximum distance, the element locations, the element dimensions, element spacing rules, and preferably an estimated compaction density that will be obtained during a subsequent compaction step.

Figure 5:
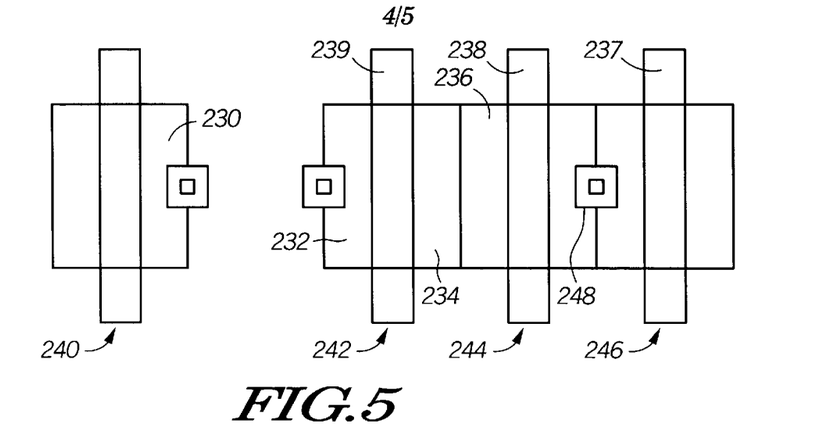
FIG. 5 is a diagrammatic top view illustrating the placement of elements within an integrated circuit.

Element spacing rules relate to the minimum required spacing between adjacent elements. FIG. 5 illustrates examples of several possible spacing rules. In the case of adjacent transistors that are not connected to each other, such as transistors 240 and 242, there must be sufficient space between the source 230 of the first transistor 240 and the drain 232 of the adjacent transistor 242 so that conduction will not occur between source 230 and drain 232. Such spacing must account not only for the properties of the material separating the elements but also the expected variations of the manufacturing process employed. The space between adjacent but unconnected transistors 240 and 242 is known as a diffusion break because the material separating the transistors has not been altered by diffusion.

In the case of adjacent transistors having diffusion portions that are connected to one other but to no other point in the circuit, a different spacing rule applies. In this situation, connected transistors 242 and 244 having no external connections must have sufficient spacing between their respective gates 239 and 238 so that conduction will not occur from gate 238 to gate 239. In operation, gates 238 and 239 may be driven to differing voltages wherein one of the transistors is turned on and one is turned off. When in this state, there must be sufficient isolation between the gates 238 and 239 to prevent unwanted conduction or cross-talk. Thus, considering variations in manufacturing processes, sufficient spacing between gates 238 and 239 through diffusion portions 234 and 236 must exist to prevent conduction between gates 238 and 239. A location at which adjacent transistors are connected to each other but to no other point in the circuit is known as a diffusion with no contact location.

Finally, in the case of adjacent transistors 244 and 246 that have diffusion portions connected to each other and to some other point in the circuit through an intervening diffusion contact 248, another element spacing rule applies. In this case, because the diffusion portions contact a metal layer in the integrated circuit, sufficient spacing must be had between each of the respective gates 238 and 237 and the diffusion contact 248 to allow the transistors 244 and 246 to properly operate considering manufacturing process variations. Locations at which adjacent transistors connect to one another as well as to some other point in the circuit through an intervening diffusion contact are known as contacted diffusion points.

In a preferred embodiment of the method 200, compaction will occur after the placement of the ties such that the elements within the integrated circuit are moved more closely together in at least the horizontal distance. Compaction must also consider the placement of connections and ties within the integrated circuit so that the integrated circuit may be manufactured. All compaction of elements must be implemented without violating element spacing rules and the spacing between connections, elements, and ties. Since the maximum tie spacing must only be complied with after compaction, the tie spacing intervals are adjusted based upon projected compaction densities. Within step 212, an interval is determined by processing the element locations, the element dimensions, and the element spacing rules. First, the maximum tie spacing distance is scaled by a factor, preferably 120%, to account for less than optimum compaction. Element widths and minimum spacing distances between adjacent elements are successively summed for adjacent elements along the integrated circuit until the scaled maximum tie spacing distance is reached. This determines an outer boundary of the interval. An inner boundary of the interval is preferably set as the reference location. Thus, the interval within which the tie is to be placed is defined to accomplish step 212.

Next, at step 214, the method 200 includes determining an optimum placement location within the interval. The optimum placement location is based upon element locations within the interval, the type of elements within the interval, any diffusion break within the interval, and the number of routing connections required at various locations along the interval. Thus, the step of determining an optimum placement location with the interval is based at least partially upon the reference location. An optimum location within the interval is determined such that a maximum compaction may occur and so that the operation of elements and routing is minimally disturbed. Preferably, ties are placed in rail regions instead of channel regions so as to minimize disturbance of elements and eliminate routing obstacles. Of course, in some situations, depending upon the well edge spacing and diffusion spacing rules, ties must be placed in channel regions as well.

Step 214 considers a most distant diffusion break within the interval from the reference location. As previously described, a diffusion break is a location within the integrated circuit between elements that has retained substrate doping levels or that is a portion of the well that has not been doped subsequent to the formation of the well. Step 214 also considers a most distant diffusion to reference voltage connection within the interval from the reference location. Diffusion to reference voltage connections typically comprise either $V_{DD}$ to P-type transistor source connections or $V_{SS}$ to N-type source connections. Further, step 214 considers a most distant diffusion with no contact within the interval from the reference location. A diffusion with no contact location typically is a drain to source connection between adjacent transistors connected in series without any other connection at the series connection point.

From step 214 the method proceeds to step 216 of placing a tie at the optimum location. This may include the placement of a well tie near a channel region, a well tie under a power rail, a substrate tie near the channel region, or a substrate tie under a ground rail. In any case, the placement of a tie in step 214 satisfies the tie placement rules for all elements within the estimated interval assuming that the efficiency of compaction assumption, as reflected in the maximum distance scale factor, was correct.

From step 216 the method proceeds to decision step 218 where it is determined whether the tie placement location was near the right edge. If the tie placement location was within tie placement rules for a last tie to be placed in the integrated circuit cell, or integrated circuit, the method is complete. However, if at step 218 the tie has not been placed near the right edge, the method proceeds to step 220 of assigning the tie placement location as the new reference location. From step 220 the method proceeds again to step 210 such that another tie may be placed at an optimum location. Steps 210 through 220 are repeated until all ties within the integrated circuit have been placed.

Thus, the method 200 illustrated in FIG. 4 places all ties within an integrated circuit such that they comply with tie spacing rules and are optimally placed. Such placement is done in a manner to minimally disrupt the operation and locations of elements within the integrated circuit and to most efficiently place the ties within the integrated circuit. The benefits of the method 200 of FIG. 4 extend not only to a reduction in design time and cost for the integrated circuit designer input but also guarantee compliance with tie spacing rules.

Figure 6:
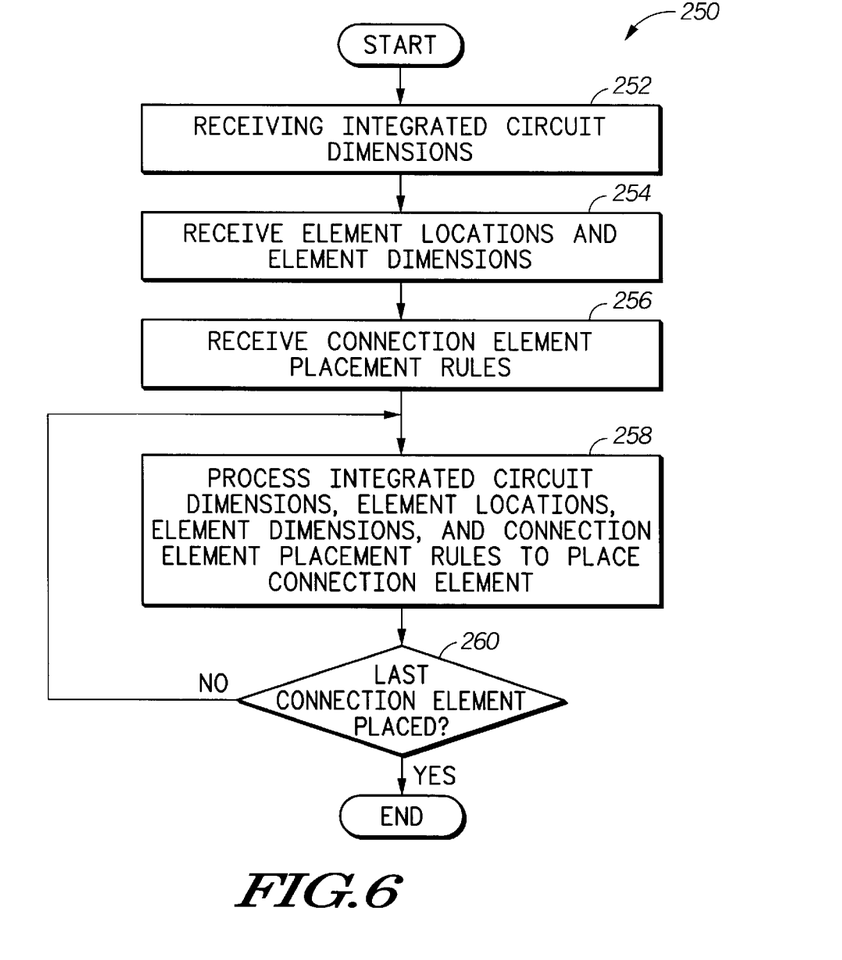
FIG. 6 is a flowchart illustrating a method for placing connection elements within an integrated circuit.

FIG. 6 illustrates a method 250 for placing connection elements within an integrated circuit. The connection elements may comprise vias, contacts, antenna diodes, and various other connection elements that are placed within an integrated circuit design as well as ties. Vias and contacts extend between layers within the integrated circuit to conduct signals between layers. Antenna diodes serve in the manufacturing process to dissipate charge from a polysilicon layer or another conductive layer to the substrate to prevent charge induced damages. Both of these connection elements must be placed in the design process. Typically these elements were placed by hand and were not optimally located in the physical integrated circuit design using prior art techniques.

Method 250 commences at step 252 of receiving integrated circuit dimensions. The integrated circuit dimensions received are consistent with those in accordance with the previous methods of the present invention. Thus, the integrated circuit dimensions represent a description of the outer boundaries and at least some of the inner boundaries within the integrated circuit. Next, step 254 includes receiving element dimensions and element locations within the integrated circuit. Thus, step 252 and step 254 include a partial physical description of the integrated circuit.

Next, at step 256, the method 250 includes receiving connection element placement rules for the integrated circuit. These element connection placement rules are dependent upon the particular type of connection elements to be placed with the method 250 of the present invention. For example, in the case of antenna diodes spacing between antenna diodes will depend upon the proximity and size of conductive gate layers and conductive metal layers. In the case of polysilicon gate layers in a CMOS design, charge may build up in the gate layer and in conductive metal layers connected to the gate layer such that, unless it is dissipated into the substrate via the antenna diodes, it will damage the transistor gate oxide layers. Thus, the connection element placement rules consider the purpose of the particular connection elements as well as the types of elements within the integrated circuit that will be affected by the operation of the connection elements.

Alternatively, in the case of a via between a first layer and a second layer, it is often desirable for the location of the via to correspond to an area of minimum channel density so that the via minimally disrupts conductors in a single layer. However, the via must fall within a certain area of the integrated circuit defamed by the element placement rules to minimize transmission delay between the layers and minimally disrupt conductors in the second layer. Thus, the method 250 of the present invention places the vias in optimum locations in accordance with the connection element placement rules.

From step 256, the method 250 proceeds to step 258 of processing the integrated circuit dimensions, element locations, element dimensions, and connection element placement rules to place a connection element within the integrated circuit. Such processing preferably performed in accordance with the method steps of the method 100 of FIG. 1 of the method 200 of FIG. 4. However, in accordance with the method 250 of FIG. 6, the step of processing is not limited by the previously described steps and may comprise steps in accordance with the particular rules used with the connection elements considered. For example, where a via between a first conductor and a second conductor must reside within a particular area of the integrated circuit, the step of processing 258 will include determining an optimum location within the area that will have the least disruption of other conductors within the area. Thus, the step of processing in accordance with the method 250 of FIG. 6 does not only consider distances in establishing the connection elements but also considers the other element locations within the integrated circuit as well.

From step 258, the method 250 proceeds to step 260 of determining whether a last connection element has been placed. If the last connection element has not been placed the method returns again to step 258 for the placement of more elements. However, if at step 260 the last connection element has been placed, the method is complete.

Thus, the method 250 of FIG. 6 provides the added benefit of placing other various connection elements within an integrated circuit in an automated fashion therefore minimizing the effect of the placement of such elements. Previously, integrated circuit designers would painstakingly place these vias and antenna diodes to minimize the effect on other structures within the integrated circuit. However, with the method 250 of the present invention, such optimized placement may be performed by a digital computer to minimize designer input and reduce the error associated with human interaction.

Figure 7:
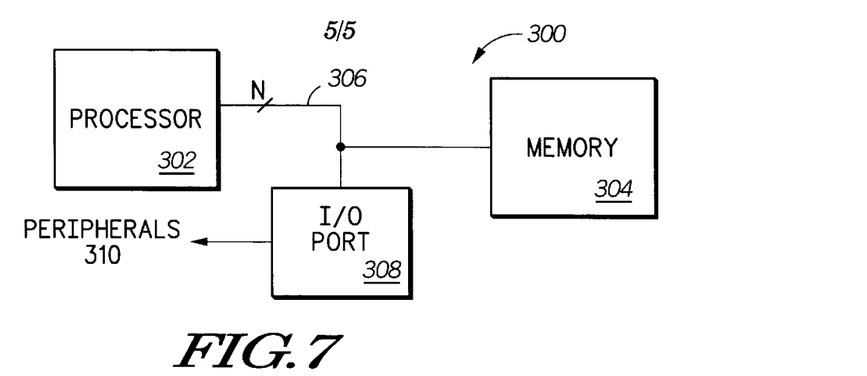
FIG. 7 is a block diagram of a data processing system in accordance with the present invention.

FIG. 7 illustrates a data processing system 300 in accordance with the present invention. The data processing system 300 comprises a processor 302, memory 304, and a processor bus 306. The data processing system 300 may further include an input/output port 308 for communicating with peripherals 310.

The processor 302 connects to the processor bus 306 and is capable of performing instructions and processing data. Preferably, the processor 302 is of a type known in the art capable of performing the steps of methods 100, 200, and 250 of the present invention. Thus, the processor 302 is capable of automatically performing the steps illustrated in the previous FIGS. 1–6 to accomplish the goals of the methods of the present invention. Preferably, the processor 302 communicates over the processor bus 306 with the memory 304 and input/output port 308. The processor bus 306 has sufficient width to pass data, instructions, and control signals between the processor 302, the memory 304, and the input/output port 308.

The memory 304 operably couples to the processor bus 306 and stores data and instructions. Particularly, the memory 304 stores instructions for receiving integrated circuit dimensions, receiving element dimensions and element locations within the integrated circuit, receiving placement rules, and instructions for processing the integrated circuit dimensions, element locations, element dimensions, and tie placement rules to place a tie within the integrated circuit to prevent latch-up and gate voltage threshold variance within the integrated circuit. Preferably, the memory 304 is of a type known in the art that provides either dynamic or static storage capabilities.

Thus, the data processing system 300 of the present invention provides the processing capability to accomplish the methods described in FIGS. 2, 4, and 5. The benefits provided by the data processing system 300 of the present invention correspond to those provided by the method of the present invention previously described. The data processing system 300 of the present invention also may be employed to accomplish the methods 200 and 250 illustrated in FIGS. 4 and 5, respectively. In one form, processor 302 may be a PowerPC™ 601 processor as discussed in the PowerPC™ 601 RISC Processor User's Manual, Rev. 1, 1993, available from Motorola. In one form, the memory 304 may be any DRAM, SRAM, or like memory, such as the a MCM72MS32 or a MCM72MS64 available from Motorola.

Figure 8:
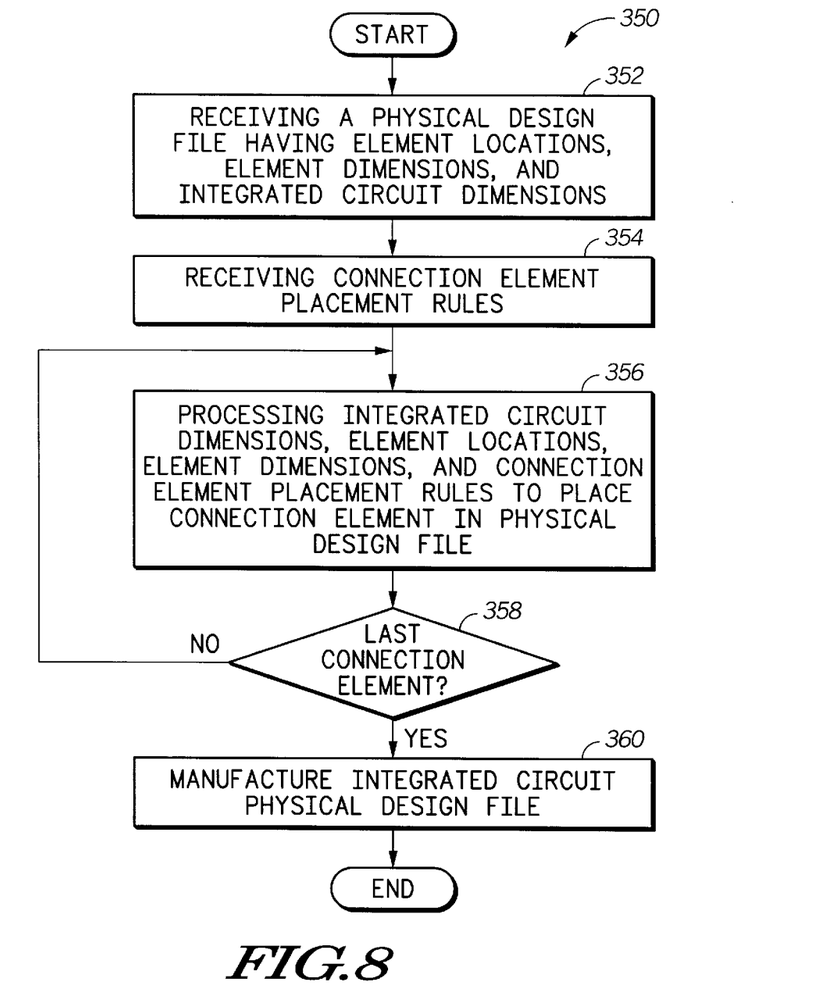
FIG. 8 is a flowchart illustrating a method of making an integrated circuit in accordance with the present invention.

FIG. 8 illustrates a method 350 for making an integrated circuit. The method 350 commences at step 352 of receiving a physical design file of an integrated circuit design. The physical design file includes integrated circuit dimensions, element dimensions, and element locations within the integrated circuit. The physical design file locates elements and connections within a two-dimensional substrate area of an integrated circuit die. Preferably, the physical design file includes physical structure for performing the functions of an integrated circuit design from which the physical design file was derived.

Next, at step 354, the method 350 includes receiving connection element placement rules. The connection element placement rules comprise those rules previously discussed. Next, at step 356, the method 350 includes processing the integrated circuit dimensions, element locations, element dimensions, and connection element placement rules to place at least one connection element within the physical design file of the integrated circuit design. Step 356 preferably incorporates the teachings described in accordance with FIGS. 2–5 to automatically place ties and other connection elements within the integrated circuit. Then, at decision step 358, it is determined whether the connection element placed was the last connection element to be placed within the physical design file. If not, the method returns to step 354. If the final connection element has been placed, the method proceeds to step 358 of manufacturing the integrated circuit die onto one or more physical substrates using the physical design file.

The method 350 of FIG. 8 therefore constructs an integrated circuit die that has connection elements optimally placed across its surface. In this fashion, latch-up and gate voltage threshold variance within the integrated circuit have been prevented, connection elements have been automatically placed in an optimal manner, and design time has been substantially reduced.

The present invention preferably also includes computer readable media where the computer readable media stores computer instructions or binary values which instruct a CPU to perform the processes taught herein. Such computer readable media may be used within a peripheral of a data processing system 300 to read instructions to memory 304 such that the processor 302 may execute the instructions. Such instructions stored in the computer readable medium will include instructions that are consistent with the methods of the present invention. In this fashion, data processing systems executing the instructions stored on the computer readable medium will execute the method of the present invention to reap the benefits of the execution of such method steps. Some examples of computer readable medium include, but is not limited to, a floppy disk, a hard disk, a compact disc (CD), an optical disk, a read only memory (ROM) chip, a static random access memory (SRAM) chip, a dynamic random access memory (DRAM) chip, an electrically erasable programmable read only memory (EEPROM) chip, an erasable programmable read only memory EPROM, a flash memory, a non-volatile memory (either ferroelectric or ferromagnetic), a magnetic tape storage device, and the like.

The methods taught herein are used to generate CAD (computer aided design) data files which contain information regarding the integrated circuit and placement of gates, transistors, and the like in the integrated circuit. These files are then used to form lithographic masks which are then used to form a plurality of integrated circuits on a plurality of wafers using an integrated circuit fabrication facility. These fabrication techniques are outlined in Silicon Processing for the VLSI Era, Vol. 1, by Wolf and Tauber, copyright 1986, published by Lattice Press.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. A method for placing ties within an integrated circuit, the method comprising the steps of:
   (a) receiving integrated circuit dimensions;
   (b) receiving element dimensions and element locations within the integrated circuit;
   (c) receiving tie placement rules;
   (d) processing the integrated circuit dimensions, element locations, element dimensions, and tie placement rules to place a tie within the integrated circuit; and
   (e) repeating step (d) until a last tie has been placed to prevent latch-up and gate voltage threshold variance within the integrated circuit.

2. The method of claim 1, wherein tie placement rules received in step (c) comprise:
   tie spacing, wherein tie spacing is a maximum spacing distance between ties within the integrated circuit;
   well edge spacing, wherein well edge spacing is a maximum spacing distance between an edge of a well and a tie; and
   diffusion spacing, wherein diffusion spacing is a maximum distance between active diffusion and a tie.

3. The method of claim 1, wherein the tie is selected from the group consisting of well ties and substrate ties, wherein a well tie comprises a connection between a conductive member adapted to provide a first reference voltage and a well, and wherein a substrate tie comprises a connection between a conductive member adapted to provide a second reference voltage and a substrate.

4. The method of claim 1, wherein the step (d) of processing the integrated circuit dimensions, element locations, element dimensions, and tie placement rules comprises the sub-steps of:
   determining a maximum distance between a reference location and a new tie;
   estimating an interval within which the new tie is eligible for placement, wherein the interval is based upon the maximum distance, the element locations, the element dimensions, and element spacing rules;
   determining an optimum placement location within the interval, wherein the optimum placement location is based upon the element locations within the integrated circuit; and
   placing the new tie at the optimum placement location.

5. The method of claim 1, further comprising the step of:
   (f) compacting the integrated circuit to minimize at least one dimension of the integrated circuit, wherein compacting the integrated circuit alters integrated circuit element locations, integrated circuit dimensions, and a location of at least one tie within the integrated circuit.

6. The method of claim 1, further comprising the steps of:
   (f) writing integrated circuit placement information and tie placement information determined in steps (d) and (e) to a data file in memory; and
   (g) manufacturing a plurality of integrated circuits containing the ties from steps (e) and (d), the plurality of integrated circuits being in accordance with the data file.

7. A method for placing ties in an integrated circuit, the method comprising the steps of:
 (a) receiving integrated circuit dimensions;
 (b) receiving element locations, element dimensions, and element spacing rules for elements within the integrated circuit;
 (c) receiving tie placement rules;
 (d) determining a maximum distance between a reference location and a new tie based upon the tie placement rules, the element locations, and the element dimensions;
 (e) estimating an interval within which the new tie is eligible for placement, wherein the interval is based upon the maximum distance, the element locations, the element dimensions, and the element spacing rules;
 (f) determining an optimum placement location within the interval, wherein the optimum placement location is based upon the element locations within the interval;
 (g) placing the new tie at the optimum placement location; and
 (h) repeating steps (d) through (g) until a last tie is placed.

8. The method of claim 7, wherein the step of determining a maximum distance between a reference location and a new tie further comprises scaling the maximum distance when the reference location is an edge of the integrated circuit.

9. The method of claim 7, wherein tie placement rules comprise:
 tie spacing, wherein tie spacing is a maximum spacing distance between ties within the integrated circuit;
 well edge spacing, wherein well edge spacing is a maximum spacing distance between an edge of a well and a tie; and
 diffusion spacing, wherein diffusion spacing is a maximum distance between active diffusion and a tie.

10. The method of claim 7, wherein the tie is selected from the group consisting of well ties and substrate ties, wherein a well tie comprises a connection between a first reference voltage and a well, and wherein a substrate tie comprises a connection between a second reference voltage and a substrate.

11. The method of claim 7, wherein the step of estimating an interval assumes a compaction of the integrated circuit, wherein the compaction alters integrated circuit dimensions and element locations.

12. The method of claim 7 wherein the reference location is a plurality of reference locations, wherein at least one reference location in the plurality of reference locations comprises a location of an existing tie.

13. The method of claim 7, wherein the step of determining an optimum placement location within the interval is based at least partially upon the reference location.

14. The method of claim 7, wherein the step of determining an optimum placement location within the interval is based at least partially upon:
 a most distant diffusion break within the interval from the reference location;
 a most distant diffusion to reference voltage connection within the interval from the reference location; and
 a most distant diffusion with no contact within the interval from the reference location.

15. The method of claim 7, wherein the step of determining an optimum placement location within the interval includes the step of determining the maximum distance from the reference location in a first direction and the method further comprises the step of:

determining a placement location of a tie within the optimum placement location in a second direction, wherein the second direction is substantially perpendicular to the first direction.

16. The method of claim 7, further comprising the step of:
 compacting the integrated circuit to minimize at least one dimension of the integrated circuit, wherein compacting the integrated circuit alters integrated circuit element locations, integrated circuit dimensions, and a location of at least one tie within the integrated circuit.

17. The method of claim 7, further comprising the steps of:
 (i) writing integrated circuit placement information and tie placement information determined in steps (d) and (h) to a data file in memory; and
 (j) manufacturing a plurality of integrated circuits containing the ties from steps (d) through
 (h), the plurality of integrated circuits being in accordance with the data file.

18. The method of claim 7, further comprising the steps of:
 (i) writing integrated circuit placement information and tie placement information determined in steps (d) and (h) to a data file in memory; and
 (j) using the data file to generate a plurality of masks in accordance with the data file;
 (k) manufacturing a plurality of integrated circuits containing the ties from steps (d) through
 (h), the plurality of integrated circuits being manufactured using the masks.

19. A method for placing connection elements within an integrated circuit, the method comprising the steps of:
 (a) receiving integrated circuit dimensions;
 (b) receiving element dimensions and element locations within the integrated circuit;
 (c) receiving connection element placement rules;
 (d) processing the integrated circuit dimensions, element locations, element dimensions, and connection element placement rules to place a connection element within the integrated circuit; and
 (e) repeating step (d) until a last connection element has been placed within the integrated circuit.

20. The method of claim 19, wherein connection element placement rules comprise:
 connection element spacing, wherein connection element spacing is a maximum spacing distance between connection elements within the integrated circuit; and
 preferred connection element associations between integrated circuit elements and connection elements.

21. The method of claim 19 wherein the connection element is selected from the group consisting of vias between a first layer and a second layer of the integrated circuit, contacts between a first layer and a second layer of the integrated circuit, antenna diodes, well ties, and substrate ties.

22. The method of claim 19, further comprising the step of:
 compacting the integrated circuit to minimize at least one dimension of the integrated circuit, wherein compacting the integrated circuit alters integrated circuit element locations, integrated circuit dimensions, and a location of at least one connection element within the integrated circuit.

23. The method of claim 19, wherein the step of processing the integrated circuit dimensions, element locations, element dimensions, and connection element placement rules comprises the sub-steps of:

determining a maximum distance between a reference location and a new connection element;

estimating an interval within which the new connection element is eligible for placement, wherein the interval is based upon the maximum distance and the element locations, element dimensions, and minimum element spacing rules;

determining an optimum placement location within the interval, wherein the optimum placement location is based upon the element locations within the integrated circuit; and     placing the new connection element at the optimum placement location.

24. The method of claim 23, wherein the step of determining an optimum placement location considers a channel density along the interval within which the new connection element may be placed.

25. A data processing system comprising:

a processor;

a processor bus operably coupled to the processor; and memory operably coupled to the processor bus for storing data and instructions, wherein the memory stores instructions for:

receiving integrated circuit dimensions;

receiving element dimensions and element locations within the integrated circuit;

receiving tie placement rules; and         processing the integrated circuit dimensions, element locations, element dimensions, and tie placement rules to place ties within the integrated circuit to prevent latch-up and gate voltage threshold variance within the integrated circuit.

26. A data processing system comprising:

a processor;

a processor bus operably coupled to the processor; and memory operably coupled to the processor bus for storing data and instructions, wherein the memory stores instructions for:

receiving integrated circuit dimensions of the integrated circuit;

receiving element locations, element dimensions, and element spacing rules for elements within the integrated circuit;

receiving tie placement rules;

determining a maximum distance between a reference location and a new tie based upon the tie placement rules, the element locations, and the element dimensions;

estimating an interval within which the new tie may be placed, wherein the interval is based upon the maximum distance, the element locations, the element dimensions, and the element spacing rules;

determining an optimum placement location within the interval, wherein the optimum placement location is based upon the element locations within the integrated circuit; and         placing a new tie at the optimum placement location.

27. A data processing system comprising:

a processor;

a processor bus operably coupled to the processor; and memory operably coupled to the processor bus for storing data and instructions, wherein the memory stores instructions for:

receiving integrated circuit dimensions;

receiving element dimensions and element locations within the integrated circuit;

receiving connection element placement rules;

processing the integrated circuit dimensions, element locations, element dimensions, and connection element placement rules to place a connection element within the integrated circuit.

28. A method for making an integrated circuit, the method comprising the steps of:

(a) receiving a physical design file of an integrated circuit design, wherein the physical design file includes integrated circuit dimensions, element dimensions, and element locations within the integrated circuit, wherein the physical design file locates elements and connections within a two-dimensional substrate area of an integrated circuit die;

(b) receiving connection element placement rules;

(c) processing the integrated circuit dimensions, element locations, element dimensions, and connection element placement rules to place at least one connection element within the physical design file of the integrated circuit design; and     (d) manufacturing the integrated circuit die onto one or more physical substrates using the physical design file.

29. A computer readable medium comprising:

a first plurality of instructions for receiving integrated circuit dimensions;

a second plurality of instructions for receiving element dimensions and element locations within the integrated circuit;

a third plurality of instructions for receiving tie placement rules;

a fourth plurality of instructions for processing the integrated circuit dimensions, element locations, element dimensions, and tie placement rules to place a tie within the integrated circuit; and     a fifth plurality of instructions for repeating the execution of the fourth plurality of instructions until a last tie has been placed to prevent latch-up and gate voltage threshold variance within the integrated circuit.

30. A computer readable medium comprising:

a first plurality of instructions for receiving integrated circuit dimensions of the integrated circuit;

a second plurality of instructions for receiving element locations, element dimensions, and element spacing rules for elements within the integrated circuit;

a third plurality of instructions for receiving tie placement rules;

a fourth plurality of instructions for determining a maximum distance between a reference location and a new tie based upon the tie placement rules, the element locations, and the element dimensions;

a fifth plurality of instructions for estimating an interval within which the new tie may be placed, wherein the interval is based upon the maximum distance, the element locations, the element dimensions, and the element spacing rules;

a sixth plurality of instructions for determining an optimum placement location within the interval, wherein the optimum placement location is based upon the element locations within the integrated circuit;

a seventh plurality of instructions for placing a new tie at the optimum placement location; and a eighth plurality of instructions for repeating steps fourth through seventh plurality of instructions until a last tie is placed.

31. A computer readable medium comprising:

a first plurality of instructions for receiving integrated circuit dimensions;

a second plurality of instructions for receiving element dimensions and element locations within the integrated circuit;

a third plurality of instructions for receiving connection element placement rules;

a fourth plurality of instructions for processing the integrated circuit dimensions, element locations, element dimensions, and connection element placement rules to place a connection element within the integrated circuit; and a fifth plurality of instructions for repeating the fourth plurality of instructions until a last connection element has been placed within the integrated circuit.

32. A data processing system comprising:

means for receiving integrated circuit dimensions;

means for receiving element dimensions and element locations within the integrated circuit;

means for receiving tie placement rules;

means for processing the integrated circuit dimensions, element locations, element dimensions, and tie placement rules to place a tie within the integrated circuit; and means for repeatedly processing ties using the above identified means until a last tie has been placed to prevent latch-up and gate voltage threshold variance within the integrated circuit.

* * * * *